United States Patent
Sugiyama

(10) Patent No.: US 8,159,283 B2
(45) Date of Patent: Apr. 17, 2012

(54) HIGH FREQUENCY SWITCH CIRCUIT COMPRISING A TRANSISTOR ON THE HIGH FREQUENCY PATH

(75) Inventor: Yuta Sugiyama, Saitama (JP)

(73) Assignee: Hitachi Metals, Ltd., Tokyo (JP)

( * ) Notice: Subject to any disclaimer, the term of this patent is extended or adjusted under 35 U.S.C. 154(b) by 402 days.

(21) Appl. No.: 11/997,258

(22) PCT Filed: Jul. 26, 2006

(86) PCT No.: PCT/JP2006/314799
§ 371 (c)(1),
(2), (4) Date: Jan. 29, 2008

(87) PCT Pub. No.: WO2007/018037
PCT Pub. Date: Feb. 15, 2007

(65) Prior Publication Data
US 2010/0090747 A1    Apr. 15, 2010

(30) Foreign Application Priority Data

Aug. 9, 2005 (JP) .................. 2005-230354
Mar. 22, 2006 (JP) .................. 2006-078355
Apr. 20, 2006 (JP) .................. 2006-116255

(51) Int. Cl.
*H03K 17/687* (2006.01)
*H01P 1/32* (2006.01)

(52) U.S. Cl. .............. 327/430; 327/434; 333/103

(58) Field of Classification Search .......... 327/430, 327/434; 333/101–103
See application file for complete search history.

(56) References Cited

U.S. PATENT DOCUMENTS

| | | | | |
|---|---|---|---|---|
| 5,694,069 A | * | 12/1997 | Kasashima et al. | 327/179 |
| 5,748,053 A | * | 5/1998 | Kameyama et al. | 333/103 |
| 5,774,792 A | | 6/1998 | Tanaka et al. | |
| 5,822,684 A | * | 10/1998 | Kitakubo | 455/78 |
| 5,903,178 A | * | 5/1999 | Miyatsuji et al. | 327/308 |
| 6,066,993 A | * | 5/2000 | Yamamoto et al. | 333/103 |
| 7,626,443 B2 | * | 12/2009 | Kitazawa et al. | 327/416 |
| 2002/0117696 A1 | | 8/2002 | Hirai et al. | |
| 2003/0197552 A1 | | 10/2003 | Watanabe | |

FOREIGN PATENT DOCUMENTS

| | | |
|---|---|---|
| CN | 1122534 A | 5/1996 |
| CN | 1372381 A | 10/2002 |
| JP | 1-120123 | 5/1989 |
| JP | 8-6653 | 1/1996 |
| JP | 8-228138 | 9/1996 |
| JP | 9-98078 | 4/1997 |
| JP | 9-116408 | 5/1997 |
| JP | 10-84267 | 3/1998 |
| JP | 2000-4149 | 1/2000 |
| JP | 2000-307413 | 11/2000 |
| JP | 2004-48692 | 2/2004 |
| JP | 2005-5858 | 1/2005 |

* cited by examiner

*Primary Examiner* — Kenneth B. Wells
(74) *Attorney, Agent, or Firm* — Finnegan, Henderson, Farabow, Garrett & Dunner LLP

(57) ABSTRACT

A high frequency switch circuit according to the present invention includes a control-voltage-generating circuit. The control-voltage-generating circuit includes a depletion type field-effect transistor, an external-control-signal-input terminal, an internal-control-voltage-output terminal, and a power-receiving terminal of the control-voltage-generating circuit. The field-effect transistor has a grounded gate, a source connected to the external-control-signal-input terminal, and a drain connected to the power-receiving terminal. The internal-control-voltage-output terminal is connected to an electrical connection path between the drain of the field-effect transistor and the power-receiving terminal.

12 Claims, 12 Drawing Sheets

HIGH FREQUENCY SWITCH CIRCUIT COMPRISING A TRANSISTOR ON THE HIGH FREQUENCY PATH

TECHNICAL FIELD

The present invention relates to a high frequency switch circuit constituted by using, in particular, a depletion type field-effect transistor, such as a high electron mobility transistor, in a switch circuit for switching a connection path of a high frequency signal.

BACKGROUND ART

In a radio communication apparatus for switching transmission and reception in time division, it is necessary to switch the connection between an antenna and a transmission/reception circuit. Alternatively, in a terminal using a plurality of frequency bands, a plurality of transmission/reception circuits are generally incorporated for the respective frequency bands, and hence it is necessary to switch signal paths between an antenna and the transmission/reception circuits. Alternatively, in a radio communication apparatus adopting diversity reception or MIMO (Multi Input Multi Output) systems, it is necessary to switch signal paths between a plurality of antennas and transmission/reception circuits A high frequency switch circuit is used for switching the signal paths. A high frequency circuit using a depletion type high electron-mobility transistor (HEMT: High Electron-Mobility Transistor) as a switch has excellent characteristics, and hence is widely used. Generally, the depletion type high electron-mobility transistor (HEMT) normally exhibits a depletion type characteristic that when the gate potential is equal to the drain/source potential, the transistor is brought into an on-state where the drain and the source are connected to each other by a low resistance, and that when the gate voltage is lower than the drain/source voltage by a threshold voltage (about 1 V), the transistor is brought into an off-state where the drain and the source are connected to each other by a high impedance.

Therefore, in the case where a high frequency switch circuit is integrated, it is more advantageous in terms of production to use the depletion type field-effect transistor for all transistors in the circuit. In order to constitute a high frequency switch circuit by using the depletion type field-effect transistor without using a negative power source, there is proposed, for example, a constitution as described in Japanese Patent Laid-Open No. 9-98078 (Patent Document 1). Further, as another method, there is proposed a circuit for generating a control voltage by using the depletion type field-effect transistor, in Japanese Patent Laid-Open No. 2000-004149 (Patent Document 2).

In addition, it is desirable that a voltage sufficiently higher than the above described threshold voltage is applied as the control voltage, but the control voltage tends to be lowered according to a trend toward a lower voltage in a recent radio communication apparatus. For example, in a mobile radio terminal as represented by a portable telephone, since a battery is used as a power source, it is strongly required to reduce power consumption in order to extend the operating time of the terminal. A digital logic circuit is used for performing various control and modulation/demodulation in the radio terminal. In order to suppress power consumption in the logic circuit, it is effective to design so that the operating voltage of the logic circuit is suppressed to be low. Therefore, in the case where the high frequency switch circuit is directly controlled by the logic circuit, it is desirable that the control voltage necessary for the high frequency switch circuit is set to be low.

However, the electric power which can generally be interrupted by an HEMT transistor is proportional to the square of the difference between the gate potential and the drain/source potential. Thus, if the control voltage is lowered, the potential difference is also reduced, as a result of which the electric power which can be handled by the high speed switch circuit is also reduced. In order to avoid this, there is proposed a method in Japanese Patent Laid-Open No. 10-84267 (Patent Document 3) and Japanese Patent Laid-Open No. 2004-48692 (Patent Document 4), in which a high frequency signal is rectified and added to a control signal, so as to increase an internal control signal.

However, in the high frequency switch circuit disclosed in Patent Document 1, when the change in the control voltage is not sufficiently large as compared with the absolute value of pinch-off voltage of the depletion type field-effect transistor used in the circuit, the circuit becomes unable to function as the switch. This problem will be described in detail below.

FIG. 1 shows a high frequency switch circuit described in Patent Document 1. In the figure, reference numerals 6 and 7 denote depletion type field-effect transistors. Reference characters 11a and 11b denote external-control-signal-input terminals. Reference numerals 14 and 15 denote an input terminal 14 and an output terminal 15 of a high frequency signal, respectively. Reference characters 21a and 21b denote resistors. Reference characters 24a, 24b and 24c denote capacitances (capacitors), respectively.

The control is performed by applying a differential voltage between the terminals 11a and 11b. At this time, it is assumed that the operating voltage of the logic circuit is set to 1.6 V, and the pinch-off voltage of the depletion type field-effect transistor used in the high frequency switch circuit is set to −1.5V. It is also assumed that a High voltage (1.6 V) is applied to the terminal 11a and a Low voltage (0 V) is applied to terminal 11b, so as to bring the high frequency switch circuit into the off-state. At this time, the drain and source voltages of each of the field-effect transistors (6, 7) are both boosted to 1.6V by the forward current of the Schottky junction of the field-effect transistor 6. Therefore, the gate-source voltage of the field-effect transistor 7 is set only to −1.6 V.

For this reason, when a high frequency signal causing the source-drain voltage of the field-effect transistor 7 to be changed by about 0.2 V is input into the field-effect transistor 7, the field-effect transistor is brought into the on-state, so that the high frequency switch circuit becomes unable to secure sufficient isolation. This results in a problem that the withstand power characteristic is reduced.

The above described problem of the withstand power characteristic can be solved by bringing the pinch-off voltage close to 0 V. However, when the pinch-off voltage is brought close to 0 V, the on-resistance of the field-effect transistor is increased, so that the insertion loss of the high frequency switch circuit is increased. For the above described reason, in the high frequency switch circuit proposed in Patent Document 1, there is a high probability that a problem may arise when an output of a logic circuit whose voltage is lowered is used as it is for the control of the high frequency switch circuit.

Further, in the inverter circuit constitution described in Patent Document 2, there is a disadvantage that even when the output terminal of the inverter is in a Low state, a voltage twice the on-voltage of a diode is output so as to reduce the change in the output voltage. Even if a differential voltage is produced by using the inverter, when the power supply voltage is set to 3 V which is a voltage of a lithium ion battery currently used in a portable telephone, the on-voltage of the diode is about 0.7 V, and hence a positive voltage of 1.4 V is output even in the case of the Low voltage output. In consideration of that the output of the High voltage is at most 3 V of the power supply voltage, the obtainable voltage difference is only 1.6 V, and hence the off-state of the field-effect transistor cannot be sufficiently secured. This results in the same problem, as in the case of Patent Document 1, that the withstand power characteristic is reduced.

In the system proposed in Patent Document 3, a switch circuit for switching a control signal needs to be provided. This results in a problem that a power source needs to be separately provided for the switch circuit, or that the number of elements constituting the circuit is large.

Further, in Patent Document 4, there is a problem that in the booster circuit of any of the proposed systems (FIG. 11, FIG. 12, FIG. 13, FIG. 14 in Patent Document 4), even in the case where the external control voltage is set to be low, when a high-power high frequency signal is applied to a high-frequency-detection terminal, a potential due to the rectifying action is added so as to increase the output voltage, and thereby a sufficient signal isolation performance cannot be obtained.

DISCLOSURE OF THE INVENTION

Problem to be Solved by the Invention

An object of the present invention is to solve the above described problem and to propose a high frequency switch circuit which is capable of controlling a high-power signal even when a low control voltage is used, and which can be easily integrated in an integrated-circuit process for a depletion type field-effect transistor.

Means for Solving Problem

To this end, the high frequency switch circuit according to the present invention is constituted as described below.

A high frequency switch circuit according to a first aspect of the present invention, having a switch circuit adapted to switch a connection state and a disconnection state of a high frequency signal path, and a control-voltage-generating circuit adapted to generate an internal control voltage for controlling the switch circuit on the basis of an external control signal, is characterized in that the control-voltage-generating circuit includes a power-receiving terminal, a depletion type field-effect transistor, an external-control-signal-input terminal, and an internal-control-voltage-output terminal, in that the field-effect transistor has a grounded gate, a source connected to the external-control-signal-input terminal, and a drain connected to the power-receiving terminal, and in that the internal-control-voltage-output terminal is connected to an electrical connection path between the drain of the field-effect transistor and the power-receiving terminal.

Preferably, the gate of the field-effect transistor is grounded via a resistor, and the drain of the field-effect transistor is connected to the power-receiving terminal via a first resistor.

A high frequency switch circuit according to a second aspect of the present invention, having a switch circuit adapted to switch a connection state and a disconnection state of a high frequency signal path, and a control-voltage-generating circuit adapted to generate an internal control voltage for controlling the switch circuit on the basis of an external control signal, is characterized in that the control-voltage-generating circuit includes a power-source terminal, a depletion type field-effect transistor, a first resistor, an external-control-signal-input terminal, and an internal-control-voltage-output terminal, in that the field-effect transistor has a grounded gate, a source connected to the external-signal-input terminal, and a drain connected to one terminal of the first resistor, in that the other terminal of the first resistor is connected to the power-source terminal, and in that the internal-control-voltage-output terminal is connected to an electrical connection path between the drain of the field-effect transistor and the one terminal of the first resistor.

Also in the second aspect of the present invention, it is preferred that the gate of the field-effect transistor is grounded via a second resistor.

A single-pole-multiple-throw-type high frequency switch circuit may also be constituted in such a manner that the plurality of high frequency switch circuits according to the first and second aspects of the present invention are used, and that one end of the high frequency signal path of each of the high frequency switch circuits is connected to a common high frequency port.

A high frequency switch circuit according to a third aspect of the present invention, having a switch circuit adapted to switch a connection state and a disconnection state of a high frequency signal path, and a control-voltage-generating circuit adapted to generate an internal control voltage for controlling the switch circuit on the basis of an external control signal, is characterized in that the control-voltage-generating circuit includes a high-frequency-circuit-connecting terminal, an external-control-signal-input terminal, a depletion type field-effect transistor, first and second resistors, an internal-control-voltage-output terminal, a capacitor, and a diode, in that the field-effect transistor has a grounded gate, a source connected to the external-control-signal-input terminal, and a drain connected to the internal-control-voltage-output terminal via a node 1, in that the first resistor has one terminal connected to the node 1 and the other terminal connected to a node 2, in that the second resistor has one terminal connected to the node 2 and the other terminal connected to the external-control-signal-input terminal, in that the capacitor has one terminal connected to the high frequency signal path via the high-frequency-circuit-connecting terminal and the other terminal connected to the node 2, in that the diode has a cathode connected to the node 2 and an anode connected to the external-control-signal-input terminal, and in that the internal-control-voltage-output terminal is connected to the switch circuit.

Also in the third aspect of the present invention, it is preferred that the gate of the field-effect transistor is grounded via a third resistor.

A high frequency switch circuit according to a fourth aspect of the present invention, having a switch circuit adapted to switch a connection state and a disconnection state of a high frequency signal path, and a control-voltage-generating circuit adapted to generate an internal control voltage for controlling the switch circuit on the basis of an external control signal, is characterized in that the control-voltage-generating circuit includes a high-frequency-circuit-connecting terminal, an external-control-signal-input terminal, a depletion type field-effect transistor, a first resistor, an internal-control-voltage-output terminal, a capacitor, and a diode, in that the field-effect transistor has a grounded gate, a source connected to the external-control-signal-input terminal, and a drain connected to a node 2, in that the diode has a cathode connected to the node 2 and an anode connected to a node 1, in that the first resistor has one terminal connected to an electrical connection path between the node 1 and the internal-control-voltage-output terminal and the other terminal connected to the external-control-signal-input terminal, in that the capacitor has one terminal connected to the high frequency signal path via the high-frequency-circuit-connecting terminal and the other terminal connected to the node 1, and in that the internal-control-voltage-output terminal is connected to the switch circuit.

Also in the fourth aspect of the present invention, it is preferred that the gate of the field-effect transistor is grounded via a second resistor.

A single-pole-multiple-throw-type high frequency switch circuit may also be constituted in such a manner that the plurality of high frequency switch circuits according to the third and fourth aspects of the present invention are used, that one end of the high frequency signal path of each of the high frequency switch circuits is connected to a common high frequency port, and one terminal of the capacitor provided in the control-voltage-generating circuit is connected to the common high frequency port via the high-frequency-circuit-connecting terminal.

In the preferred aspect of the high frequency switch circuit according to the present invention, any active element used in the high frequency switch circuit is a depletion type field-effect transistor having substantially the same pinch-off voltage as the field-effect transistor.

Further, the first resistor provided in the high frequency switch circuit according to the present invention may be an active load, and the internal-control-voltage-output terminal may also be connected to the switch circuit via a low pass filter. Such low pass filter is constituted by, for example, a resistor and a capacitor.

Note that when the high frequency switch circuits according to the present invention are used to constitute a single-pole-multiple-throw-type high frequency switch circuit, any of the high frequency switch circuits combined with each other is not necessarily capable of functioning as an independent "high frequency switch circuit". A single-pole-multiple-throw-type high frequency switch circuit is also constituted in such a manner that the above described plurality of control-voltage-generating circuits are used and connected to a common high frequency port.

According to the present invention, it is possible to directly control a high frequency switch circuit by a logic circuit using a low voltage as its operating voltage. This contributes to reduce the voltage of logic circuits in a wireless communication terminal, and to thereby reduce power consumption of the wireless communication terminal.

Further, this circuit can be integrated by semiconductor process for depletion type pHEMT (Pseudomorphic High Electron-Mobility Transistor) which has already been put in practical use, and hence can be produced at a low cost.

Further, since the gate of the above described depletion type field-effect transistor is grounded via the resistor, even when an excessive voltage is applied to the external-control-signal-input terminal, it is possible to prevent the thermal destruction of the field-effect transistor by suppressing the current, and to thereby contribute to the improvement in reliability of the high frequency switch circuit.

Further, the high frequency switch circuit is constituted by using only the depletion type field-effect transistors having substantially the same pinch-off voltage as an active element, which makes it possible to realize the circuit without adding a new process in the case of integration, at a low cost. Alternatively, by substituting an active load for the resistor in the control-voltage-generating circuit, it is also possible to save the chip area in the case of integrating the circuit and to thereby reduce the cost.

Alternatively, in the present invention, by connecting the internal-control-voltage-output terminal to the switch circuit via the low pass filter consisting of the resistor and the capacitor, it is possible to realize means for preventing the generation of harmonics and instability due to the feedback of a signal, without obstructing the integration, and easily.

The high frequency switch circuit according to the present invention, constituted as described above, can be used for high frequency radio communication apparatuses required to switch high frequency signal paths, such as a portable telephone and a wireless LAN terminal which correspond to the transmission/reception time division system and multi-band.

BEST MODE FOR CARRYING OUT THE INVENTION

In the following, preferred embodiments according to the present invention will be described with reference to the accompanying drawings.

Embodiment 1

Figure 1:
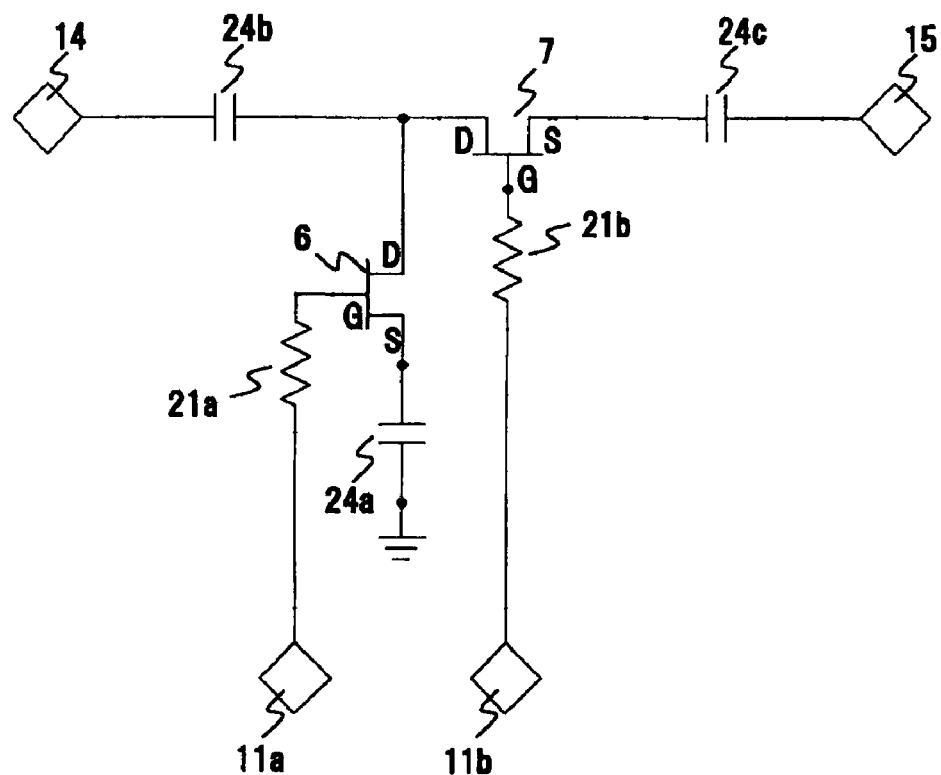
FIG. 1 is a figure for explaining a constitution example of a conventional high frequency switch circuit.
Figure 2:
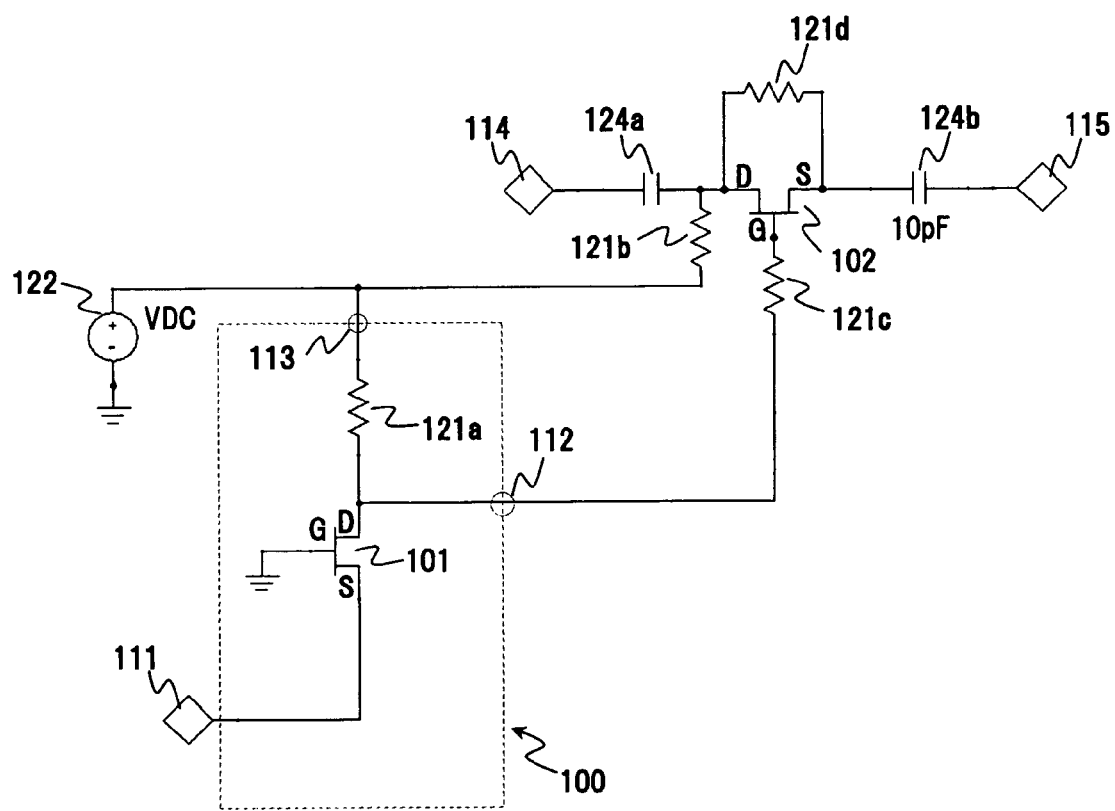
FIG. 2 is a circuit diagram of a high frequency switch circuit as a first embodiment according to the present invention.

FIG. 2 is a circuit diagram of a high frequency switch circuit as a first embodiment according to the present invention. In the figure, reference numerals 114 and 115 denote an input terminal 114 and an output terminal 115 of a high frequency signal in the high frequency switch circuit, respectively. Reference numerals 101 and 102 denote depletion type field-effect transistors, and reference characters 121a to 121d denote resistors. The input terminal 114 and output terminal 115 of the high frequency signal are provided via a switch circuit including the depletion type field-effect transistor 102 for performing switching between a connection state and a disconnection state of a high frequency signal path.

Note that in the present embodiment, the resistor 121a used in a control-voltage-generating circuit 100 is a resistor formed of a tantalum nitride thin film. Further, reference characters 124a and 124b denote capacitors serving as a sufficiently small impedance in a high frequency band to be used, and reference numeral 122 denotes a power source.

In the circuit constitution example shown in the figure, the resistance value of the resistors 121a to 121d is set to 30 kΩ, and the capacitance value of the capacitors 124a and 124b is set to 10 pF. Further, the operating voltage of a logic circuit for controlling the high frequency switch circuit is set to 1.6 V. A lithium ion battery having a voltage of 3 V is used as the power source 122.

The portion denoted by reference numeral 100 in the figure is a control-voltage-generating circuit (booster circuit) provided in the high frequency switch circuit. In the control-voltage-generating circuit 100, the depletion type field-effect transistor 101, an external-control-signal-input terminal 11, an internal-control-voltage-output terminal 112, and a power-receiving terminal 113 of the control-voltage-generating circuit are provided. In the depletion type field-effect transistor 101, the gate is grounded, the source is connected to the external-control-signal-input terminal 111, and the drain is electrically connected to the power-receiving terminal 113. The internal-control-voltage-output terminal 112 is connected to an electrical connection path between the drain of the depletion type field-effect transistor 101 and the power-receiving terminal 113.

A specific operation of the control-voltage-generating circuit 100 will be described in detail below. In the control-voltage-generating circuit 100 which is a circuit adapted to generate an internal control voltage for controlling the switch circuit on the basis of an external control signal from the external-control-signal-input terminal 111, the gate of the depletion type field-effect transistor 101 provided in the circuit is grounded, and a bias (Vb) not smaller than the absolute value of the pinch-off voltage of the field-effect transistor 101 is applied to the source of the field-effect transistor 101 from the external-control-signal-input terminal 111. On the other hand, the drain of the field-effect transistor 101 is connected to the power-receiving terminal 113, and a bias (Va: Va>Vb) which is sufficiently larger than the absolute value of the pinch-off voltage of the field-effect transistor 101 is applied to the drain from the power-receiving terminal 113.

In the present embodiment, the frequency of the high frequency signal is set to 2.5 GHz. Further, the field-effect transistors 101 and 102 are FETs produced on the same chip by a Pseudomorphic High Electron-Mobility Transistor (pHEMT) process, and have almost the same pinch-off voltage. Note that the gate length of the field-effect transistor 101 is set to 100 μm, and the gate length of the field-effect transistor 102 is set to 1 mm. The gate width of both the field-effect transistors is set to 1 μm.

Figure 3:
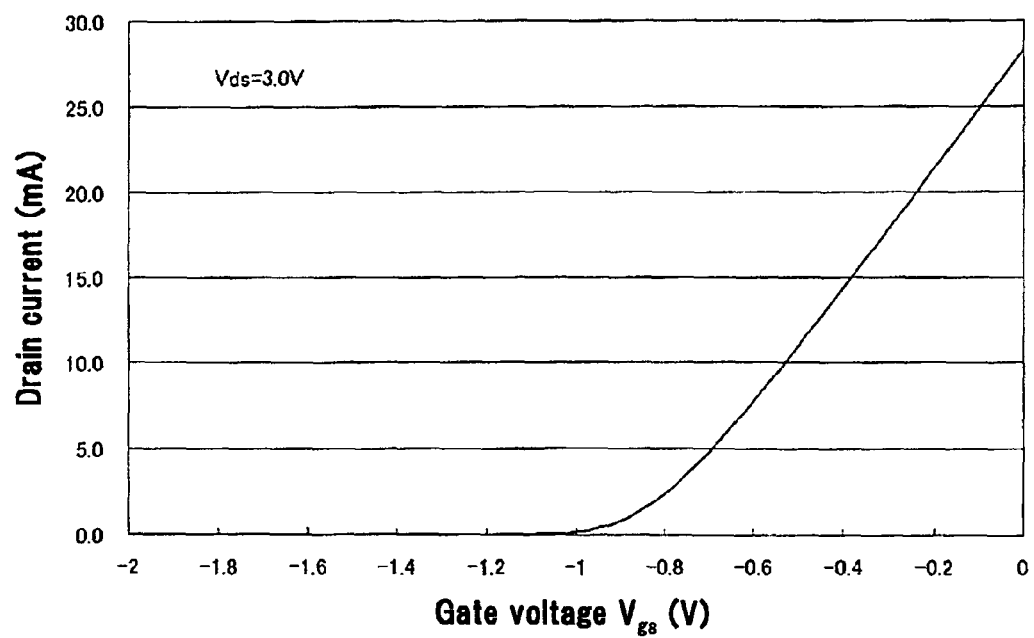
FIG. 3 is a figure for explaining a gate voltage dependency of drain current of the field-effect transistor used in the circuit shown in FIG. 2.

FIG. 3 is a figure showing the drain current of the field-effect transistor 101 in the case where the gate voltage is changed under the condition that the drain-source voltage (Vds) is set to 3 V. When the gate-source voltage (Vgs) is −1.6 V, the drain current is not larger than 0.1 μA, while when the gate-source voltage (Vgs) is 0 V, the drain current is about 27 mA.

In the following, an operation of the high frequency switch circuit will be described. Now, there is considered a case where a High voltage of 1.6 V in the logic circuit is applied to the external-control-signal-input terminal 111. Since the gate of the field-effect transistor 101 is grounded, the gate-source voltage is set to −1.6V, so that the drain current becomes not larger than 0.1 μA. Thus, the current flowing through the resistor 121a is also set to not larger than 0.1 μA, so that the voltage drop across the resistor becomes not larger than 3 mV (0.1 μA×30 kΩ). As a result, the voltage of the internal-control-voltage-output terminal 112 is set to 3 V which is substantially equal to the power source voltage. From this, it can be seen that an operating voltage of the logic circuit may be not smaller than the absolute value of the pinch-off voltage in order to make a voltage substantially equal to the power source voltage output from the internal-control-voltage-output terminal 112. Further, as is apparent from the foregoing, the consumed current of the control-voltage-generating circuit 100 at this time is not larger than 0.1 μA.

As shown in FIG. 2, the internal-control-voltage-output terminal 112 of the control-voltage-generating circuit 100 is connected to the gate of the field-effect transistor 102. For this reason, a voltage of about 3 V is applied to the gate of the field-effect transistor 102 under the above described condition that the voltage of the internal-control-voltage-output terminal 112 is substantially equal to the power source voltage.

Further, the resistor 121d is connected between the source and drain terminals of the field-effect transistor 102, in order to make the potentials of both the terminals equal to each other. The resistor 121d has a resistance value about 30 kΩ, so that the high frequency signal current is prevented from flowing between the source and drain terminals of the field-effect transistor 102. In addition, the drain of the field-effect transistor 102 is connected to the power source 122 via the resistor 121b, so that both the drain voltage and the source voltage of the field-effect transistor 102 are set to about 3 V.

That is, in this state, the gate-source voltage of the field-effect transistor 102 is set to 0 V, so that the field-effect transistor 102 is brought into the on-state. As a result, the high-frequency-signal terminals 114 and 115 are connected to each other, so that the high frequency switch circuit is brought into the state (on-state) of passing the high frequency signal.

Next, there is considered a case where a Low voltage 0 V is applied to the external-control-signal-input terminal 111 from the logic circuit. The gate-source voltage of the field-effect transistor 101 at this time is set to 0 V, and a voltage of 3 V is applied between the drain and the source, so that the drain current of 27 mA is allowed to flow. As described above, the resistance value of the resistor 121a is 30 kΩ, and the drain current of 27 mA is a current value 100 times or more of the current allowed to flow through the resistor 121a, as a result of which it is possible to approximately regard that the field-effect transistor 102 is short-circuited. Therefore, the voltage of the internal-control-voltage-output terminal 112 is set to about 0 V.

In this state, the potential of the gate of the field-effect transistor 102 is set to 0 V, and hence the gate-source voltage is set to −3 V. Therefore, the field-effect transistor 102 is brought into the off-state. Thereby, the high-frequency-signal terminals 114 and 115 are isolated from each other, so that the high frequency switch circuit is brought into the off-state. Further, a sufficiently large reverse voltage as compared with the pinch-off voltage (−1.6V) of the field-effect transistor 102 is applied. Thus, even when a fluctuation of the source potential is caused by a high frequency signal, the field-effect transistor is not easily turned on, and hence it is possible to obtain a high withstand power characteristic.

In addition, the consumed current of the control-voltage-generating circuit 100 at this time is as small as 0.1 mA (=3V/30 kΩ).

Embodiment 2

Figure 4:
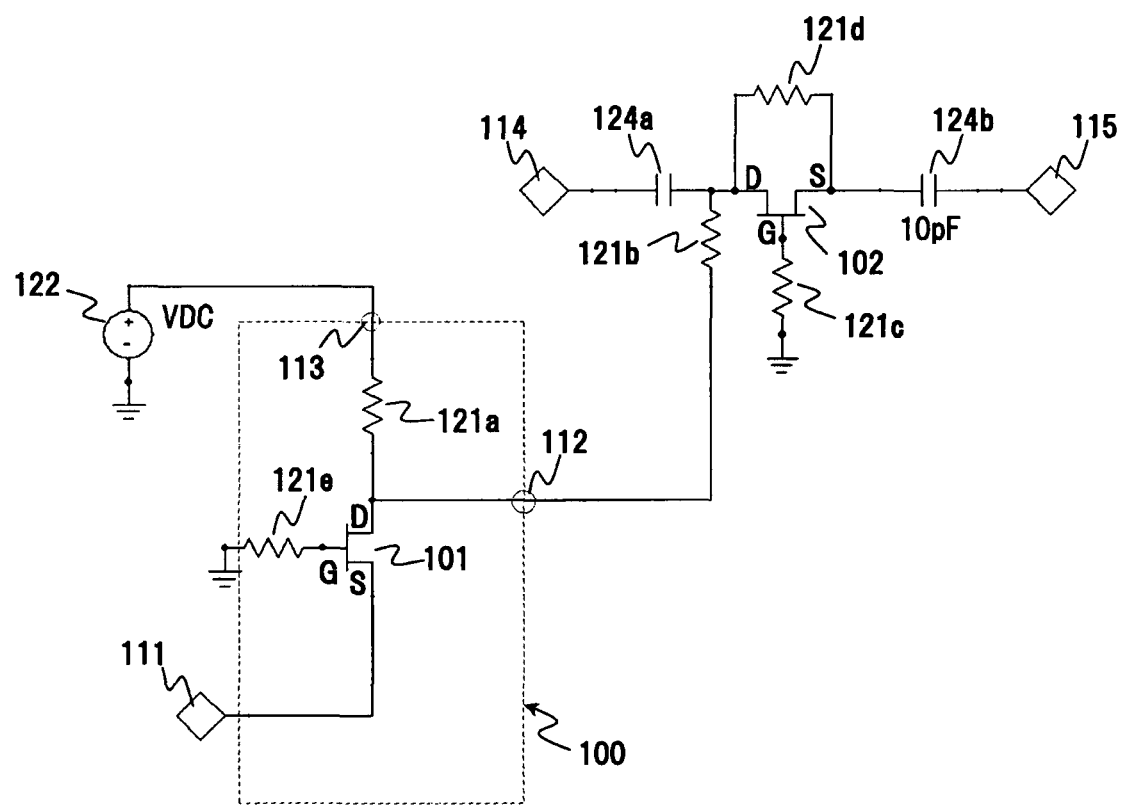
FIG. 4 is a circuit diagram of a high frequency switch circuit as a second embodiment according to the present invention.

FIG. 4 is a circuit diagram of a high frequency switch circuit as a second embodiment according to the present invention. Note that in the figure, the same elements as those shown in FIG. 2 are denoted by the same numerals and characters. In this high frequency switch circuit, the gate of a field-effect transistor 101 used in a control-voltage-generating circuit 100 is grounded via a resistor 121*e*.

Since the gate of the field-effect transistor 101 is grounded via the resistor 121*e* in this way, even when an excessive voltage is input from an external-control-signal-input terminal 111, the current caused by the excessive voltage necessarily flows through a resistor 121*a* or the resistor 121*e*, so that the voltage applied to the field-effect transistor 101 (current flowing through the transistor) is suppressed.

In this way, the field-effect transistor 101 is protected to some extent against an input of overvoltage, and hence it is possible to expect that the reliability of the high frequency switch circuit is improved.

Next, an operation of the high frequency switch circuit according to the present embodiment will be described. There is considered a case where a High voltage of 1.6 V in a logic circuit is applied to the external-control-signal-input terminal 111. The reverse current of Schottky connection of the field-effect transistor 101 is not larger than 0.1 μA at the gate-source voltage of −1.6 V, and hence the voltage across the resistor 121*e* is not larger than 3 mV. Therefore, the potential of the gate of the field-effect transistor 101 is substantially equal to the ground potential. For this reason, an internal-control-voltage-output terminal 112 is set to 3V similarly to the control-voltage-generating circuit of Embodiment 1, and a capacitor 124*a* is charged via a resistor 121*b*, so that the source-drain voltage of a field-effect transistor 102 is set to 3 V.

Note that the current flowing into the gate of the field-effect transistor 102 is negligible because the current flowing direction is reverse to the Schottky connection. Thus, the gate-source voltage of the field-effect transistor 102 is set to −3V, so that the high frequency switch circuit is brought into the off-state.

Next, in the case where the logic circuit applies 0 V to the external-control-signal-input terminal 111, the internal-control-voltage-output terminal 112 outputs 0 V similarly to Embodiment 1. Since the electric charge of the capacitor 124*a* is also discharged via the resistor 121*b* at this time, the source-drain voltage of the field-effect transistor 102 is set to 0 V, so that the gate-source voltage of the field-effect transistor 102 is set to 0 V. Thus, the connection between the source and the drain of the field-effect transistor 102 is effected so that the high frequency switch circuit is brought into the on-state.

Embodiment 3

Figure 5:
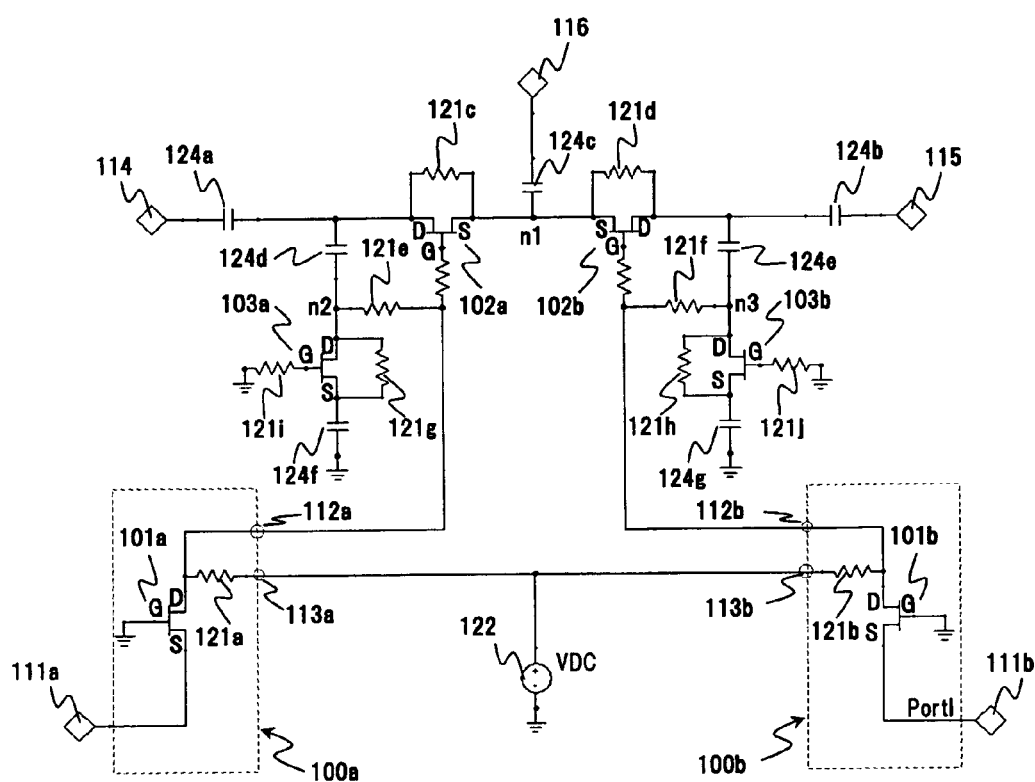
FIG. 5 is a circuit diagram of a high frequency switch circuit as a third embodiment according to the present invention.

FIG. 5 is a circuit diagram of a high frequency switch circuit as a third embodiment according to the present invention. In the present embodiment, a single-pole-double-throw (SPDT) circuit is realized. Note that also in FIG. 5, the same elements as those shown in FIG. 2 are denoted by the same reference numerals and characters. However, in correspondence with the high frequency switch circuit being provided with two control-voltage-generating circuits (100*a*, 100*b*), suffixes a and b are respectively attached to components of the control-voltage-generating circuits, for example, as in external-control-signal-input terminals 111*a* and 111*b*.

In the following, an operation of the high frequency switch circuit according to the present embodiment will be described. The high frequency switch circuit according to the present embodiment includes the two control-voltage-generating circuits 100*a* and 100*b*, and complementary external control signal voltages from a logic circuit are applied to the respective external-control-signal-input terminals 111*a* and 111*b*.

Note that power-receiving terminals 113*a* and 113*b* of these two control-voltage-generating circuits are both connected to a single power source 122, and are electrically connected to the drain side terminals of the field-effect transistors 101*a* and 101*b* which are provided in the respective control-voltage-generating circuits, via resistors 121*a* and 121*b*, respectively.

When a High voltage of 1.6 V is applied to the external-control-signal-input terminal 111*a*, and a voltage of 0 V is applied to the external-control-signal-input terminal 111*b* from the logic circuit, voltages of 3 V and 0 V are output from internal-control-voltage-output terminals 112*a* and 112*b*, respectively.

A capacitor 124*a* is charged by the forward current of the Schottky connection of a field-effect transistor 102*a*, on the basis of the output of 3 V from the internal-control voltage-output terminal 112*a*, so that the potential of a node n1 is set to 3 V. Similarly, the potential of a node n2 connected to the internal-control-voltage-output terminal 112*a* is also set to +3 V. On the other hand, the potential of a node n3 is set to 0 V on the basis of the output of 0 V from the internal-control-voltage-output terminal 112*b*.

Therefore, the gate-source voltages of the field-effect transistor 102*a*, a field-effect transistor 102*b*, a field-effect transistor 103*a*, and a field-effect transistor 103*b* are set to 0 V, −3 V, −3 V, and 0 V, respectively. Thus, the connection states of the respective switches are set in such a manner that the field-effect transistor 102*a* is on, the field-effect transistor 102*b* is off, the field-effect transistor 103*a* is off, and the field-effect transistor 103*b* is on.

As a result, high-frequency-signal terminals 114 and 116 are connected in terms of high frequency, and a high-frequency-signal terminal 115 is insulated. Further, since the field-effect transistor 103*b* is in the on-state, a high-frequency-signal terminal 115 is grounded in terms of high frequency. The grounding of the high-frequency-signal terminal 115 enables a leak of high frequency signal current from the field-effect transistor 102*b* which is in the off-state, to be discharged to the ground, and thereby an excellent insulation state can be maintained.

Further, when by the logic circuit, a Low voltage of 0 V is applied to the external-control-signal-input terminal 111*a*, and a voltage of 1.6 V is applied to the external-control-signal-input terminal 111*b*, because of the same reason as described above, at this time, the high-frequency-signal terminals 115 and 116 are connected to each other, and the high-frequency-signal terminal 114 is insulated.

Embodiment 4

Figure 6:
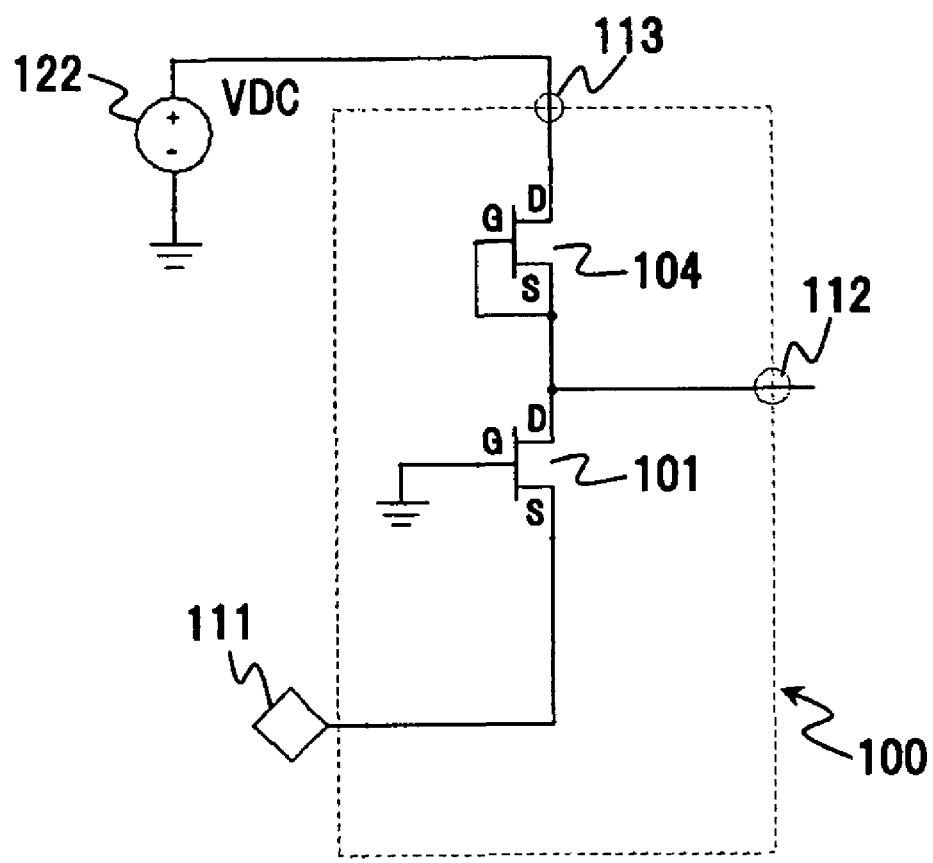
FIG. 6 is a circuit diagram of a high frequency switch circuit as a fourth embodiment according to the present invention.

FIG. 6 is a circuit diagram for explaining a fourth embodiment of a control-voltage-generating circuit included in a high frequency switch circuit according to the present invention. In the semiconductor process of the above described Embodiment 1, the resistor used in the control-voltage-generating circuit is formed of a tantalum nitride thin film whose minimum line width is 5 µm, and whose sheet resistance is 50Ω/. Therefore, in order to form the thin film into the resistor having a resistance value of 30 kΩ, a length as long as 3 mm is needed.

Thus, in the present embodiment, as shown in FIG. 6, a depletion type field-effect transistor 104 whose gate (terminal) is connected to the source (terminal) is used as an active load, so as to be substituted for the resistor 121*a* shown in FIG. 2. The other constitution is the same as that of the control-voltage-generating circuit 100 shown in FIG. 2. Note that the gate width of the field-effect transistor 104 used as the active load is 5 µm. Further, the gate width of a field-effect transistor 101 is 100 µm similarly to Embodiment 1.

When a High voltage of 1.6 V is applied to an external-control-signal-input terminal 111, a field-effect transistor 101 is in the off-state, and the field-effect transistor 104 as the active load is in the on-state, so that a voltage of 3 V which is the same as a voltage of a power source 122 is output from an internal-control-voltage-output terminal 112.

When a Low voltage of 0 V is applied to the external-control-signal-input terminal 111, both the field-effect transistor 101 and the field-effect transistor 104 are in the on-state, but the field-effect transistor 104 as the active load operates in the saturation area because of its narrow gate width (5 µm), so that the current flowing into the source terminal of the field-effect transistor 104 is set to about 2 mA.

On the other hand, the field-effect transistor 101 operates in the non-saturation area because of its wide gate width (100 µm), so that a large drain current is allowed to flow as compared with the current flowing into the source terminal of the field-effect transistor 104. This causes a voltage drop of 0.05 V between the drain and the source of the field-effect transistor 101, so that a voltage of 0.05 V is output from the internal-control-voltage-output terminal 112.

Embodiment 5

Figure 7:
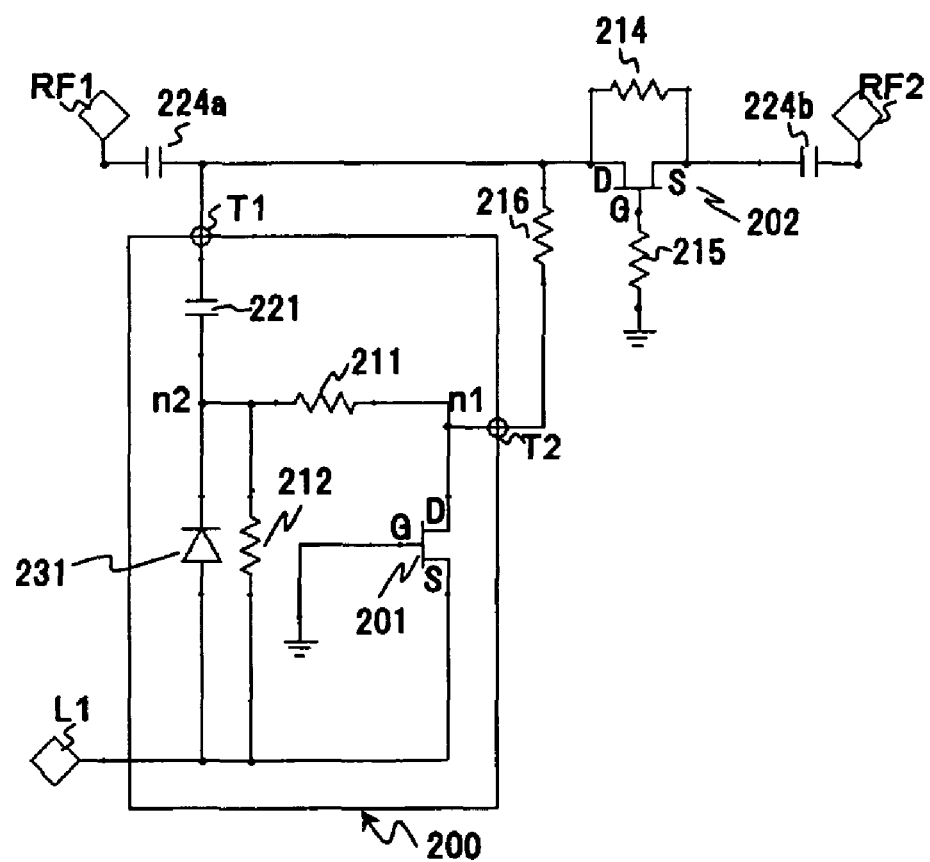
FIG. 7 is a circuit diagram of a high frequency switch circuit as a fifth embodiment according to the present invention.

FIG. 7 is a circuit diagram of a high frequency switch circuit as a fifth embodiment according to the present invention. In the figure, reference numeral 202 denotes a depletion type field-effect transistor which constitutes a switch circuit for switching passage and interruption of a high frequency signal between high frequency ports RF1 (input side) and RF2 (output side). In the switch circuit, the source terminal and the drain terminal of the depletion type field-effect transistor 202 are connected to high frequency signal paths, and a resistor 214 is connected between the source and the drain so that DC potentials of the source and the drain are kept equal to each other. The gate terminal of the field-effect transistor 202 is grounded via a resistor 215.

Since the field-effect transistor 202 is a depletion type, when the potential of the gate terminal is higher than the potential of the source/drain terminal by a threshold voltage, the field-effect transistor 202 is brought into the on-state between the source and drain terminals. When the potential of the gate terminal is lower than the potential of the source/drain terminal by a threshold voltage, the field-effect transistor 202 is brought into the off-state. Note that in the case of present embodiment, the threshold voltage of the field-effect transistor 202 is set to −1.1 V.

In FIG. 7, reference numeral 200 denotes a control-voltage-generating circuit. Reference character L1 denotes an external-control-signal-input terminal, T2 denotes an internal-control-voltage-output terminal, and T1 denotes a high-frequency-circuit-connecting terminal. Reference numeral 221 denotes a capacitor, 231 denotes a Schottky diode. Reference numerals 211 and 212 each denote a resistor having a resistance value of 10 kΩ. Further, reference numeral 201 denotes a depletion type field-effect transistor which is an FET produced by the same process as the field-effect transistor 202 of the same depletion type, and has a threshold voltage of −1.1 V. Note that reference character n1 denotes the position of a node 1, and n2 denotes the position of a node 2.

In the depletion type field-effect transistor 201 provided in the control-voltage-generating circuit 200, the gate is grounded, the source terminal is connected to the external-control-signal-input terminal L1, and the drain terminal is connected to the node 1 (n1).

One terminal of the first resistor 211 is connected to the node 1 (n1), and the other terminal of the first resistor 211 is connected to the node 2 (n2). Further, the internal-control-voltage-output terminal T2 is connected to the node 1 (n1). One terminal of the capacitor 221 is connected to a high frequency signal path via the high-frequency-circuit-connecting terminal T1, and the other terminal of the capacitor 221 is connected to the node 2 (n2).

The cathode of the diode 231 is connected to the node 2 (n2), and the anode of the diode 231 is connected to the external-control-signal-input terminal L1. Further, one terminal of the second resistor 212 is connected to the node 2 (n2), and the other terminal of the second resistor 212 is connected to the external-control-signal-input terminal L1. Further, the internal-control-voltage-output terminal T2 of the control-voltage-generating circuit 200 is connected to the drain terminal of the depletion type field-effect transistor 202 constituting the switch circuit via a resistor 216.

The resistor 216 is a load provided for suppressing the effects of the control-voltage-generating circuit 200 on the high frequency signal, and has a resistance value sufficiently larger than the characteristic impedance of the high frequency signal path. Since the characteristic impedance of the high frequency signal path is practically 50Ω or 75Ω, the resistance value of the resistor 216 is set to 10 kΩ in the present embodiment.

Note that the connection between the internal-control-voltage-output terminal T2 and the switch circuit may also be effected by connecting the resistor 216 to the source terminal or the gate terminal of the depletion type field-effect transistor 202, other than by connecting the resistor 216 to the drain terminal of the depletion type field-effect transistor 202. Further, the switch circuit is not limited to the constitution shown in FIG. 7 which is constituted by the depletion type field-effect transistor 202.

Note that the capacitance of the capacitor 221 needs to be sufficiently small in order to suppress the effects of the control-voltage-generating circuit 200 on the high frequency signal to a negligible extent. However, when the capacitance is too small, the rectifying action does not occur, so that a sufficient voltage is not generated. Therefore, it is preferred to set the capacitance of the capacitor 221 to be larger than the capacitance value of the Schottky diode 231. Note that in present embodiment, the capacitance of capacitor 221 is set to 0.1 pF.

Next, an operation of the high frequency switch circuit according to the present embodiment will be described.

First, when a High voltage of 1.6 V in a logic circuit is applied to the external-control-signal-input terminal L1, and also when a high frequency signal input into the high frequency port RF1 is small in power, a voltage amplitude in the node 2 (n2) is also sufficiently small because of the small power of the high frequency signal, and hence the rectifying action by the Schottky diode 231 is not generated. As a result, the potential difference between the gate and source terminals of the depletion type field-effect transistor 201 is set to −1.6 V, so that the depletion type field-effect transistor 201 is brought into the off-state.

On the other hand, the potential of the node 1 (n1) is set to 1.6 V, and is output to the drain terminal of the depletion type field-effect transistor 202 via the resistor 216 from the internal-control-voltage-output terminal T2. Since the drain and the source of the field-effect transistor 202 are connected to each other via the resistor 214, the potentials of the drain and the source are kept equal to each other, so that the potential of the source of the field-effect transistor 202 is also set to 1.6 V. Therefore, the potential difference between the gate and source terminals of the field-effect transistor 202 is set to −1.6 V, so that the depletion type field-effect transistor 202 is brought into the off-state. As a result, the high frequency ports RF1 and RF2 are brought into the isolation state.

Next, there is considered a case where the High voltage of 1.6 V in the logic circuit is applied to the external-control-signal-input terminal L1, and where a high frequency signal input into the high frequency port RF1 is large in power. In this case, because of the high power of the high frequency signal, the voltage amplitude of the node 2 (n2) is also made to be sufficiently large through the capacitor 221, so that the rectifying action by the Schottky diode 231 is generated. This causes the potential of the node 2 (n2) to be increased according to the power of the high frequency signal.

At this time, the depletion type field-effect transistor 201, in which the potential difference between the gate and the source terminals is set to −1.6 V, is in the off-state. Thus, from the internal-control-voltage-output terminal T2, a potential higher than 1.6 V is output by the rectifying action, so that the potential difference between the gate and source terminals of the depletion type field-effect transistor 202 is also set to be higher than the external control signal potential of 1.6 V.

Note that the power which can be interrupted by an HEMT transistor is generally proportional to the square of the difference between the gate potential and the drain/source potential, and hence the power which can be interrupted by the depletion type field-effect transistor 202 is also increased.

When a Low voltage of 0 V in the logic circuit is applied to the external-control-signal-input terminal L1, and also when the high frequency signal input into the high frequency port RF1 is small in power, the voltage amplitude of the node 2 (n2) is also sufficiently small because of the small power of the high frequency signal, so that the rectifying action by the Schottky diode 231 is not generated. As a result, the potential difference between the gate and source terminals of the depletion type field-effect transistor 201 is set to 0 V, so that the depletion type field-effect transistor 201 is brought into the on-state.

Then, the potential of the node 1 (n1) is set to 0 V. This potential is output to the drain terminal of the depletion type field-effect transistor 202 from the internal-control-voltage-output terminal T2 via the resistor 216, so that the potential difference between the gate and source terminals of the field-effect transistor 202 is set to 0 V. As a result, the depletion type field-effect transistor 202 is brought into the on-state, so that the high frequency ports RF1 and RF2 are brought into the connection state in terms of high frequency.

When the Low voltage of 0 V in the logic circuit is applied to the external-control-signal-input terminal L1, and also when the high frequency signal input into the high frequency port RF1 is large in power, the voltage amplitude of the node 2 (n2) is set to be sufficiently large through the capacitor 221 because of the high power of the high frequency signal, so that the rectifying action by the Schottky diode 231 is generated. Therefore, the DC potential of the node 2 (n2) is also increased according to the power of the high frequency signal.

However, at this time, the depletion type field-effect transistor 201 is in the on-state because the potential difference between the gate and source terminals is set to 0 V, so that the resistance (on-resistance) between the source and the drain is sufficiently small. This makes the potential of the node 1 (n1) substantially equal to the potential of 0 V at the external-control-signal terminal L1.

This potential is output to the drain terminal of the depletion type field-effect transistor 202 from the internal-control-voltage-output terminal T2 via the resistor 216, so that the potential difference between the gate and source terminals of the depletion type field-effect transistor 202 is also set to 0 V. Thus, the field-effect transistor 202 is brought into the on-state, so that the high frequency ports RF1 and RF2 are brought into the connection state in terms of high frequency.

In this way, the high frequency switch circuit according to the present embodiment is operated as a high frequency switch circuit which is capable of controlling interruption and passage of a high-power high frequency signal even by a low voltage external control signal.

Embodiment 6

Figure 8:
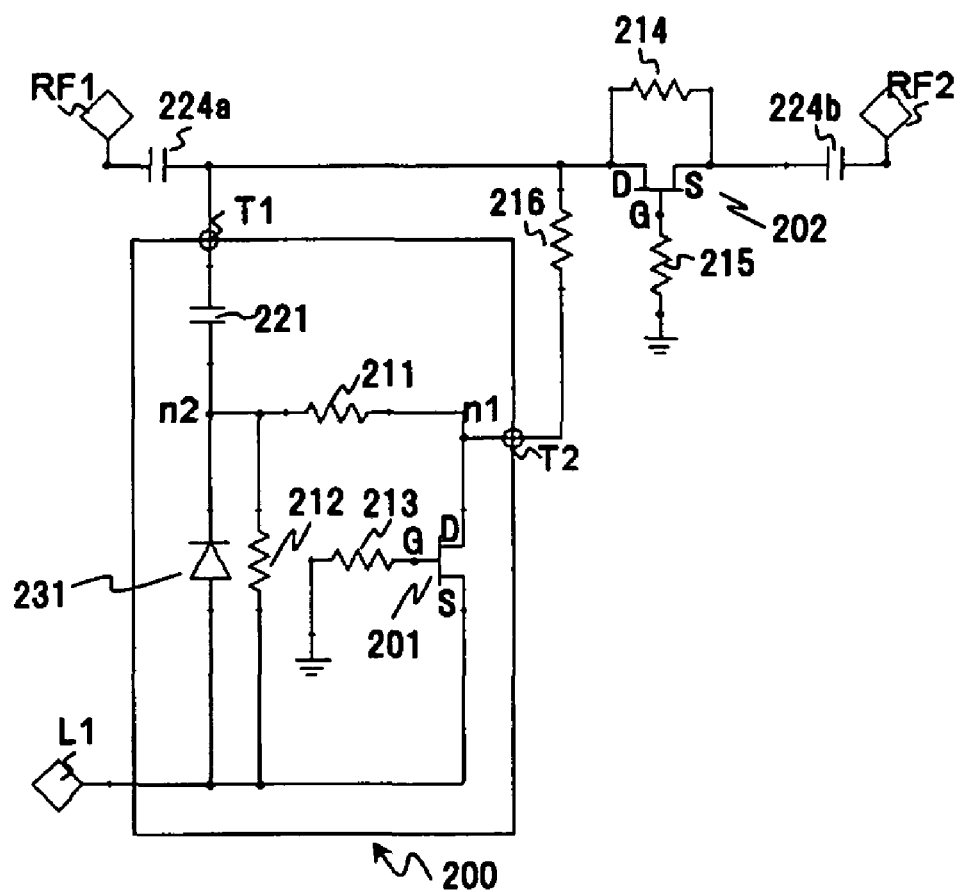
FIG. 8 is a circuit diagram of a high frequency switch circuit as a sixth embodiment according to the present invention.

FIG. 8 is a circuit diagram of a high frequency switch circuit as a sixth embodiment according to the present invention, in which circuit the gate of the depletion type field-effect transistor 201 of the fifth embodiment shown in FIG. 7 is grounded via a resistor 213. Since the gate of the field-effect transistor 201 is grounded via the resistor 213 in this way, even when an excessive voltage is input into the external-control-signal-input terminal L1, it is possible to prevent a large current flowing into the gate of the field-effect transistor 201, and to thereby prevent the field-effect transistor 201 from being destructed.

Embodiment 7

Figure 9:
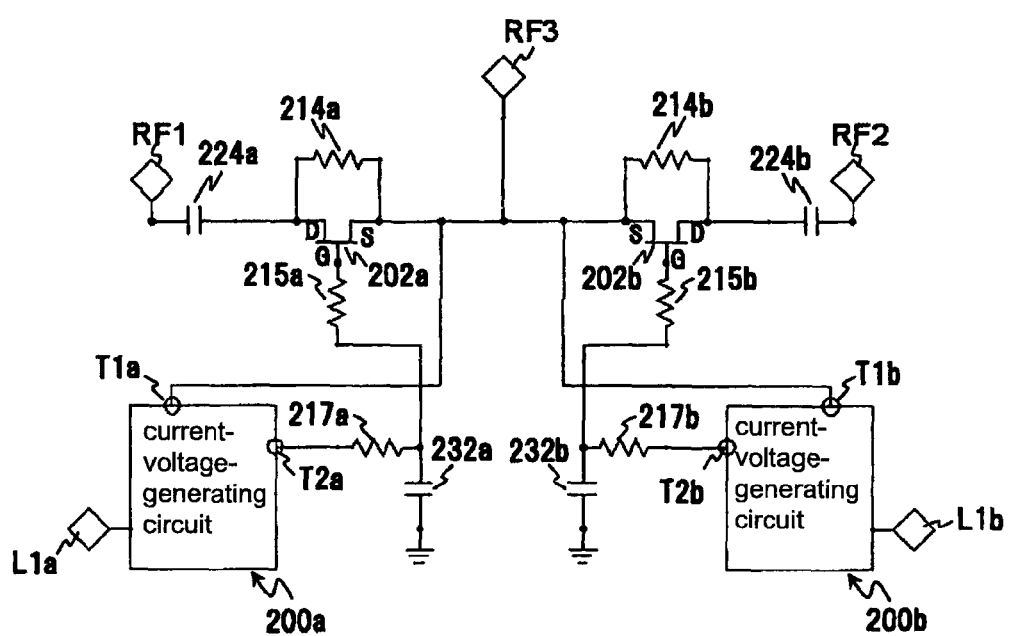
FIG. 9 is a circuit diagram of a high frequency switch circuit as a seventh embodiment according to the present invention.

FIG. 9 is a circuit diagram of a single pole double throw (SPDT) type high frequency switch circuit as a seventh embodiment according to the present invention. Reference characters 202a and 202b in the figure denote depletion-type Schottky gate field-effect transistors which constitute a switch circuit for switching high frequency signal paths, and in which the source and the drain are connected via resistors 214a and 214b, respectively.

The drain terminals of the field-effect transistors 202a and 202b are respectively connected to high frequency ports RF1 and RF2 via capacitors 224a and 224b which serve as a sufficiently small impedance in a high frequency band.

Note that control-voltage-generating circuits 200a and 200b have the same constitution as that of the control-voltage-generating circuit (200 in FIG. 8) of the sixth embodiment, and hence the details of the circuit constitution are not shown.

Reference characters L1a and L1b denote external-control-signal-input terminals of the control-voltage-generating circuits 200a and 200b, to which terminals complementary control signal voltages are applied from an external circuit (not shown). Further, internal-control-voltage-output terminals T2a and T2b of the control-voltage-generating circuits 200a and 200b are respectively connected to the gate terminals of the depletion-type Schottky gate field-effect transistors 202a and 202b of the switch circuit, via low pass filters which are respectively constituted by resistors 217a and 217b and capacitors 232a and 232b, and via resistors 215a and 215b.

High-frequency-circuit-connecting terminals T1a and T1b of the control-voltage-generating circuits 200a and 200b are connected to a high frequency port RF3. Since the high frequency switch circuit according to the present embodiment is an SPDT type high frequency switch circuit using the high frequency port RF3 as a common terminal, the high-frequency-circuit-connecting terminals T1a and T1b are connected to the high frequency signal path in any of the case where the RF1 and the RF3 are connected to each other, and the case where the RF2 and the RF3 are connected to each other.

The complementary control signals are input into the external-control-signal-input terminals L1a and L1b in this high frequency switch circuit, and hence a High potential is output from one of the internal-control-voltage-output terminals (T2a, T2b) of the control-voltage-generating circuits 200a and 200b.

Here, when it is assumed that the external-control-signal-input terminal L1b is set to the High potential, the internal-control-voltage-output terminal T2b is set to the High potential, for the same reason as in the case of the above described Embodiment 5. Thus, the gate terminal of the depletion-type Schottky gate field-effect transistor 202b is also set to the High potential, and its source and drain terminals are also set to the High potential via the Schottky junction.

At this time, since the voltage between the gate and source terminals of the depletion type field-effect transistor 202b becomes higher than the threshold voltage, the field-effect transistor 202b is brought into the on-state, so that the connection between the drain and source terminals is effected. On the other hand, the internal-control-voltage-output terminal T2a is set to a Low potential, by which the gate terminal of the depletion type field-effect transistor 202a is set to the Low potential. Further, the drain terminal and the source terminal of the field-effect transistor 202a are connected to the source terminal of the depletion type field-effect transistor 202b in terms of DC, and thereby are set to the same potential (High potential) as that of the source terminal of the depletion type field-effect transistor 202b. As a result, a reverse voltage is applied to the Schottky junction of the gate terminal of the depletion type field-effect transistor 202a, so that the current is prevented from flowing.

At this time, since the voltage between the gate and source terminals of the depletion type field-effect transistor 202a is set to be lower than the threshold value, the depletion type field-effect transistor 202a is brought into the off-state, so that the source terminal and the drain terminal of the field-effect transistor 202a are disconnected. As a result, the high frequency ports RF2 and RF3 are connected to each other, while the RF1 is in the disconnection state.

When the power of the high frequency signal passing between the source and drain terminals of the field-effect transistor 202b is increased, the High potential output from the control-voltage-generating circuit 200b is also increased, so that the potentials of the source terminal and the drain terminal of the depletion type field-effect transistors (202a, 202b) are also increased.

On the other hand, the output potential of the control-voltage-generating circuit 200a does not depend on the high frequency power and is kept to 0 V, so that there is no change in the potential of the gate terminal of the field-effect transistor 202a. Therefore, the potential difference between the gate and the source of the field-effect transistor 202a is increased, which makes it possible to maintain the isolation state without deteriorating the isolation between the high frequency ports RF1 and RF3, even for a high-power high frequency signal.

Further, when the external-control-signal-input terminal L1a is set to the High potential, the high frequency ports RF1 and RF3 are connected to each other as opposed to the above described case. Even in this case, a high frequency signal passes through the common high frequency port RF3. Thus, each of the high-frequency-circuit-connecting terminals T1a and T1b is connected to the high frequency signal path, and the control-voltage-generating circuit (200a, 200b) can be effectively operated. As a result, the potential difference between the gate and the source of the depletion type field-effect transistor 202b is increased, which makes it possible to maintain the isolation state without deteriorating the isolation between the high frequency ports RF2 and RF3, even for a high-power high frequency signal.

Embodiment 8

Figure 10:
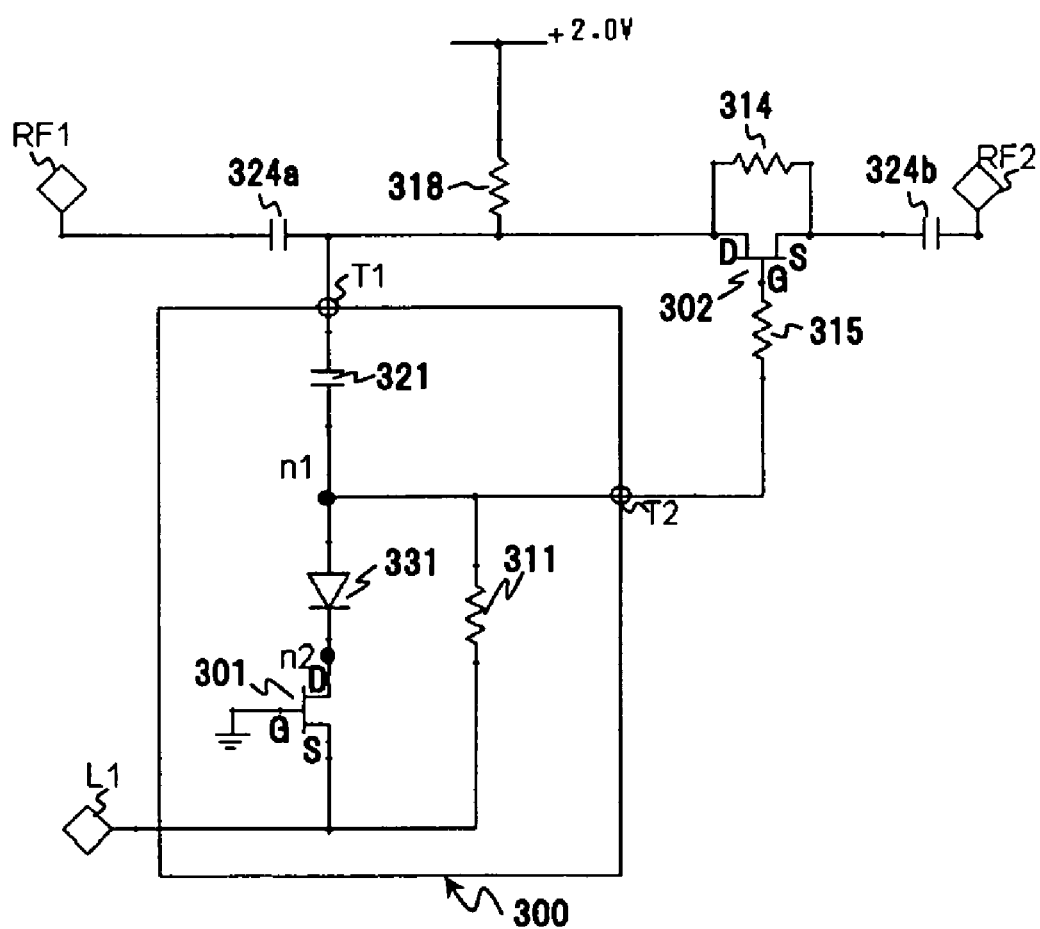
FIG. 10 is a circuit diagram of the high frequency switch circuit as an eighth embodiment according to the present invention.

FIG. 10 is a circuit diagram of a high frequency switch circuit as an eighth embodiment according to the present invention. In the figure, reference numeral 302 denotes a depletion type field-effect transistor which constitutes a switch circuit for switching passage and interruption of a high frequency signal between high frequency ports RF1 and RF2. In the switch circuit, the source terminal and the drain terminal of the depletion type field-effect transistor 302 are connected to high frequency signal paths, and a resistor 314 is connected between the source and the drain so that DC potentials of the source and the drain are kept equal to each other. Further, the drain terminal of the field-effect transistor 302 is pulled up to a potential of 2.0 V via a resistor 318.

Since the field-effect transistor 302 is a depletion type, when the potential of the gate terminal is higher than the source/drain terminal potential by a threshold voltage, the field-effect transistor 302 is brought into the on-state between the source and drain terminals. When the potential of the gate terminal is lower than the source/drain terminal potential by a threshold voltage, the field-effect transistor 202 is brought into the off-state. Note that in the case of present embodiment, the threshold voltage of the field-effect transistor 302 is −1.1 V.

Reference numeral 300 denotes a control-voltage-generating circuit included in the high frequency switch circuit according to the present embodiment. Reference character L1 denotes an external-control-signal-input terminal, T2 denotes an internal-control-voltage-output terminal, and T1 denotes a high-frequency-circuit-connecting terminal. Reference numeral 321 denotes a capacitor, 331 denotes a Schottky diode, 311 denotes a resistor having a resistance value of 10 kΩ, and 301 denotes a depletion type field-effect transistor. Note that reference character n1 denotes the position of a node 1, and n2 denotes the position of a node 2.

In the control-voltage-generating circuit 300, the gate terminal of the depletion type field-effect transistor 301 is grounded, the source terminal of the field-effect transistor 301 is connected to the external-control-signal-input terminal L1, and the drain terminal of the field-effect transistor 301 is connected to the node 2 (n2).

One terminal of the resistor 311 is connected to the node 1 (n1), and the other terminal of the resistor 311 is connected to the external-control-signal-input terminal L1. Further, the node 1 (n1) is connected to the internal-control-voltage-output terminal T2. The internal-control-voltage-output terminal T2 is connected to the gate terminal of the depletion type field-effect transistor 302 via a resistor 315.

One terminal of the capacitor 321 is connected to the high-frequency-circuit-connecting terminal T1 so as to be connected to the high frequency signal path, and the other terminal of the capacitor 321 is connected to the node 1 (n1). The cathode of the diode 331 is connected to the node 2 (n2), and the anode of the diode 331 is connected to the node 1 (n1).

The resistor 315 is provided to prevent the control-voltage-generating circuit 300 from affecting the high frequency signal, and has a resistance value sufficiently larger than the characteristic impedance of the high frequency signal path. Since the characteristic impedance of the high frequency signal path is practically 50Ω or 75Ω, the resistance value of the resistor 315 is set to 10 kΩ in the present embodiment.

Note that the capacitance of the capacitor 321 needs to be sufficiently small in order to suppress the effects of the control-voltage-generating circuit 300 on the high frequency signal to a negligible extent. However, when the capacitance is too small, the rectifying action does not occur, and a sufficient voltage is not generated. Therefore, it is preferred to set the capacitance of the capacitor 321 to be larger than the capacitance value of the Schottky diode 331. Note that in present embodiment, the capacitance of capacitor 321 is set to 0.1 pF.

The depletion type field-effect transistor 301 is produced by the same process as the field-effect transistor 302 of the same depletion type, and has a threshold voltage of −1.1 V.

Reference characters 324a and 324b denote capacitors which are provided to cut DC components and to apply a bias voltage of 2.0 V to the source terminal and the drain terminal of the depletion type field-effect transistor 302. However, the capacitors are provided on the premise to pass high frequency signals, and hence need to have a sufficiently large capacitance value. In the present embodiment, the capacitance of each of the capacitors 324a and 324b is set to 10 pF.

Next, an operation of the high frequency switch circuit according to the present embodiment will be described.

First, when a High voltage of 2.0 V in a logic circuit is applied to the external-control-signal-input terminal L1, and when a high frequency signal input into the high frequency port RF1 is small in power, a voltage amplitude at the node 1 (n1) is also sufficiently small because of the small power of the high frequency signal, so that the rectifying action by the Schottky diode 331 is not generated.

Thereby, the potential of the external-control-signal-input terminal L1 is output from the internal-control-voltage-output terminal T2 to the gate terminal of the depletion type field-effect transistor 302 via the resistor 311 and the resistor 315, so that the potential difference between the gate and source terminals of the field-effect transistor 302 is set to 0 V.

As a result, the depletion type field-effect transistor 302 is brought into the on-state, so that the high frequency ports RF1 and RF2 are connected to each other.

Next, there is considered a case where the High voltage of 2.0 V in the logic circuit is applied to the external-control-signal-input terminal L1, and where a high frequency signal input into the high frequency port RF1 is large in power. In this case, because of the high power of the high frequency signal, the voltage amplitude at the node 1 (n1) also becomes large enough through the capacitor 321 to cause the rectifying action of the Schottky diode 331. Here, when the forward current is made to flow through the Schottky diode 331, it is necessary that the potential of the node 2 (n2) is set to be higher than the potential of the source terminal of the depletion type field-effect transistor 301

However, in this case, the voltage of 2.0 V is applied to the source terminal of the depletion type field-effect transistor 301, and hence the drain terminal is also set to a potential not smaller than 2.0 V. As a result, the potential difference between the source/drain terminal and the gate terminal is set to −2.0 V, so that the field-effect transistor 301 is brought into the off-state. For this reason, the forward current is not allowed to flow. Further, the reverse current is not allowed to flow through the Schottky diode 331 due to the characteristic of the diode, unless the applied voltage is larger than the withstand voltage of the diode. Thus, it can be seen that neither the forward current nor the reverse current flows through the Schottky diode 331, and the rectifying action is not actually generated.

Then, the potential applied to the external-control-signal-input terminal L1 is output from the internal-control-voltage-output terminal T2 via the resistor 311, and hence the potential difference between the gate and source terminals of the depletion type field-effect transistor 302 is set to 0 V. Thereby, the field-effect transistor 302 is brought into the on-state, so that the high frequency ports RF1 and RF2 are connected to each other.

When a Low voltage of 0 V in the logic circuit is applied to the external-control-signal-input terminal L1, and when the high frequency signal input into the high frequency port RF1 is small in power, the voltage amplitude at the node 1 (n1) is also sufficiently small because of the small power of the high frequency signal, so that the rectifying action by the Schottky diode 331 is not generated. The node 1 (n1) is in the state of 0 V by being connected to the external-control-signal-input terminal L1 via the resistor 311. This voltage is output to the gate terminal of the depletion type field-effect transistor 302 from the internal-control-voltage-output terminal T2 via the resistor 315.

Thus, the potential of the gate of the depletion type field-effect transistor 302 is also set to 0 V, so that the potential difference between the gate and source terminals is set to −2.0 V. As a result, the field-effect transistor 302 is brought into the off-state, so that the high frequency ports RF1 and RF2 are isolated from each other in terms of high frequency.

When the Low voltage of 0 V in the logic circuit is applied to the external-control-signal-input terminal L1, and when the high frequency signal input into the high frequency port RF1 is large in power, the voltage amplitude at the node 1 (n1) becomes sufficiently large through the capacitor 321 because of the high power of the high frequency signal, so that the rectifying action by the Schottky diode 331 is generated.

Since the potential difference between the gate and source terminals of the depletion type field-effect transistor 301 is set to 0 V, the depletion type field-effect transistor 301 is in the on-state. Thereby, the current of the Schottky diode 331 cannot be prevented from flowing, so that the DC potential at the node 1 (n1) is set to be lower than 0 V by the rectifying action of the Schottky diode 331. This potential is output to the gate terminal of the depletion type field-effect transistor 302 from the internal-control-voltage-output terminal T2 via the resistor 315. Thereby, the potential difference between the gate and source terminals of the depletion type field-effect transistor 302 is set to be lower than −2.0 V, so as to bring the field-effect transistor 302 into the off-state, as a result of which the high frequency ports RF1 and RF2 are isolated from each other in terms of high frequency.

Further, the potential difference between the gate and source terminals of the depletion type field-effect transistor 302 is set to be lower than −2.0 V, which makes it possible to interrupt larger power.

In this way, the high frequency switch circuit according to the present embodiment is operated as a high frequency switch circuit capable of controlling passage and interruption of a high-power high frequency signal even by a low voltage external control signal.

Embodiment 9

Figure 11:
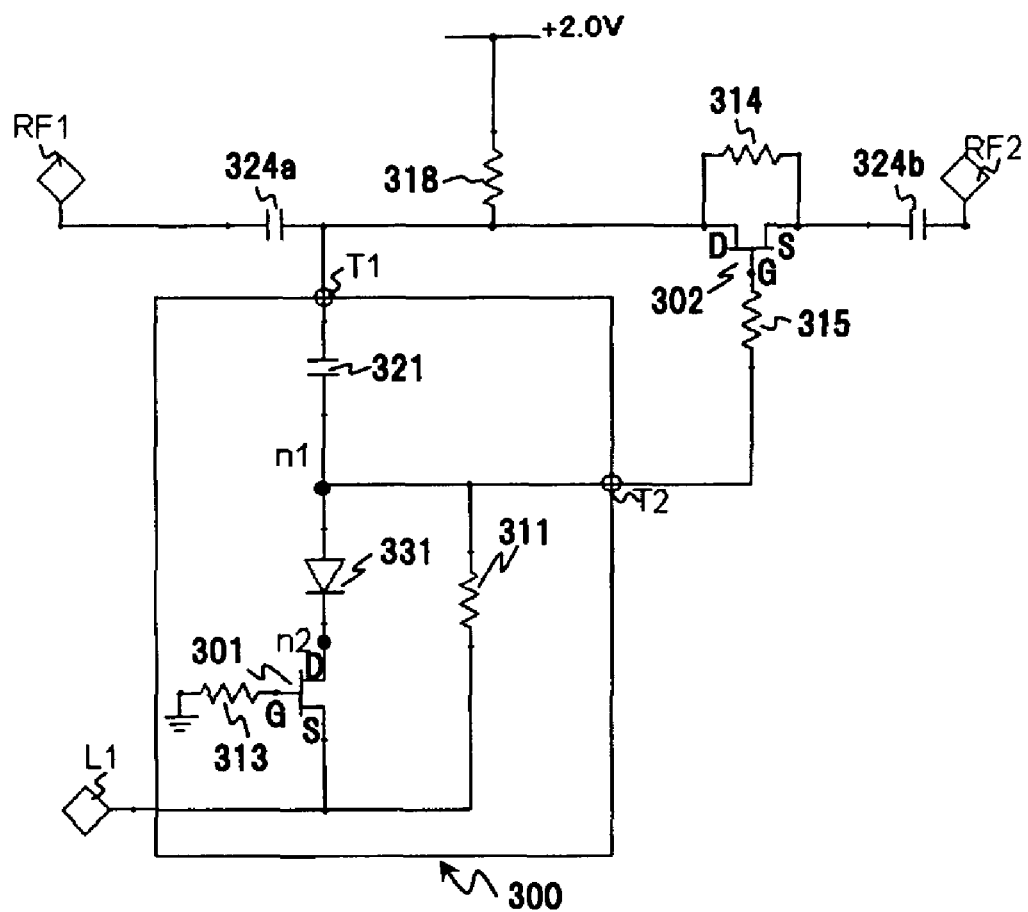
FIG. 11 is a circuit diagram of a high frequency switch circuit as a ninth embodiment according to the present invention.

FIG. 11 is a circuit diagram of a high frequency switch circuit as a ninth embodiment according to the present invention. In the circuit, the gate of the depletion type field-effect transistor 301 of the eighth embodiment shown in FIG. 10 is grounded via a resistor 313. Since the gate of the field-effect transistor 301 is grounded via the resistor 313 in this way, even when an excessive voltage is input into the external-control-signal-input terminal L1, it is possible to prevent a large current from flowing into the gate of the field-effect transistor 301, and to thereby prevent the field-effect transistor 301 from being destructed.

Embodiment 10

Figure 12:
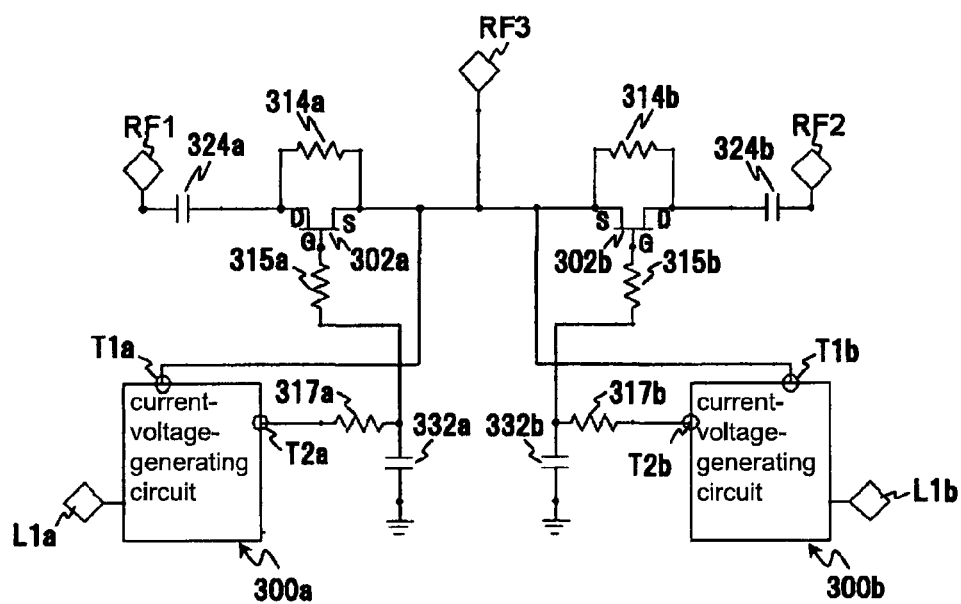
FIG. 12 is a circuit diagram of a high frequency switch circuit as a tenth embodiment according to the present invention.

FIG. 12 is a circuit diagram of a single pole double throw (SPDT) type high frequency switch circuit as a tenth embodiment according to the present invention. Reference characters 302a and 302b in the figure denote depletion-type Schottky gate field-effect transistors which constitute a switch circuit for switching high frequency signal paths. In the field-effect transistors, the source and the drain are connected to each other via resistors 314a and 314b, respectively.

The drain terminals of the field-effect transistors 302a and 302b are respectively connected to high frequency ports RF1 and RF2 via capacitors 324a and 324b which serve as a sufficiently small impedance in a high frequency band.

Note that control-voltage-generating circuits 300a and 300b have the same constitution as that of the control-voltage-generating circuit (300 in FIG. 11) of the ninth embodiment, and hence the details of the circuit constitution is not shown.

Reference characters L1a and L1b denote external-control-signal-input terminals of the control-voltage-generating circuits 300a and 300b, to which terminals complementary control signal voltages are applied from an external circuit (not shown). Further, internal-control-voltage-output terminals T2a and T2b of the control-voltage-generating circuits 300a and 300b are respectively connected to the gate terminals of the depletion-type Schottky gate field-effect transistors 302a and 302b of the switch circuit, via low pass filters which are respectively constituted by resistors 317a and 317b and capacitors 332a and 332b, and via resistors 315a and 315b.

High-frequency-circuit-connecting terminals T1a and T1b of the control-voltage-generating circuits 300a and 300b are connected to a high frequency port RF3. Since the high frequency switch circuit according to the present embodiment is an SPDT type high frequency switch circuit using the high frequency port RF3 as a common terminal, the high-frequency-circuit-connecting terminals T1a and T1b are connected to the high frequency signal path in any of the case where the RF1 and the RF3 are connected to each other, and the case where the RF2 and the RF3 are connected to each other.

The complementary control signals are input into the external-control-signal-input terminals L1a and L1b in this high frequency switch circuit, and hence a High potential is output from one of the internal-control-voltage-output terminals (T2a, T2b) of the control-voltage-generating circuits 300a and 300b.

Here, when it is assumed that the external-control-signal-input terminal L1b is set to the High potential, the internal-control-voltage-output terminal T2b is set to the High potential for the same reason as in the case of the above described Embodiment 8, so that the gate terminal of the depletion-type Schottky gate field-effect transistor 302b is also set to the High potential, and its source and drain terminals are also set to the High potential via the Schottky junction.

At this time, the voltage between the gate and source terminals of the depletion type field-effect transistor 302b is set to be higher than the threshold voltage, so that the field-effect transistor 302b is brought into the on-state, and the connection between the drain and source terminals is effected. On the other hand, the internal-control-voltage-output terminal T2a is set to a Low potential, by which the gate terminal of the depletion type field-effect transistor 302a is set to the Low potential. Further, the drain terminal and the source terminal of the field-effect transistor 302a are connected to the source terminal of the depletion type field-effect transistor 302b in terms of DC, and thereby are set to the same potential (High potential) as that of the source terminal of the depletion type field-effect transistor 302b. As a result, a reverse voltage is applied to the Schottky junction of the gate terminal of the depletion type field-effect transistor 302a, so that the current is prevented from flowing.

At this time, the voltage between the gate and source terminals of the depletion type field-effect transistor 302a is set to be lower than the threshold value. Thereby, the field-effect transistor 302a is brought into the off-state, so that the source terminal and the drain terminal of the field-effect transistor 302a are disconnected from each other. As a result, the high frequency ports RF2 and RF3 are connected to each other, while the RF1 is brought into the disconnection state.

When the power of the high frequency signal passing between the source and drain terminals of the field-effect transistor 302b is increased, the Low potential output from the control-voltage-generating circuit 300a is lowered, so that the potential of the gate of the depletion type field-effect transistors 302a is also lowered.

On the other hand, the output potential of the control-voltage-generating circuit 300b does not depend on the high frequency power and is kept to 2.0 V, so that there is no change in the potential at the gate terminal of the field-effect transistor 302b. Therefore, the potential difference between the gate and the source of the field-effect transistor 302b is increased, which makes it possible to maintain the isolation state between the high frequency ports RF1 and RF3 without deteriorating the isolation, even for a high-power high frequency signal.

Further, when the external-control-signal-input terminal L1a is set to the High potential, the high frequency ports RF1 and RF3 are connected to each other as opposed to the above described case. Even in this case, since a high frequency signal passes through the common high frequency port RF3, each of the high-frequency-circuit-connecting terminals T1a and T1b is connected to the high frequency signal path, so that the control-voltage-generating circuit (300a, 300b) can be effectively operated. As a result, the potential difference between the gate and the source of the depletion type field-effect transistor 302b is increased, which makes it possible to maintain the isolation state between the high frequency ports RF2 and RF3 without deteriorating the isolation, even for a high-power high frequency signal.

In the present embodiment, the low pass filters which are respectively constituted by the resistors (317a, 317b) and the capacitors (332a, 332b), are connected to the gate terminals of the depletion type field-effect transistors (302a, 302b), respectively. This makes it possible to obtain such effects that harmonics generated by the control-voltage-generating circuits (300a, 300b) are attenuated, that the harmonics are prevented from being mixed into the high frequency signal, and that the oscillation due to the positive feedback is prevented.

As described above, the high frequency switch circuit according to the present invention is described on the basis of the embodiments, but the embodiments are only examples for carrying out the present invention, and hence the present invention is not limited to these embodiments.

For example, in all embodiments of the high frequency switch circuit according to the present invention, it is possible to ground via a resistor the gate of the field-effect transistor provided in the control-voltage-generating circuit, and to connect the drain of the field-effect transistor to a power-receiving terminal (or power-source terminal) via a resistor.

Further, in all embodiments of the high frequency switch circuit according to the present invention, it is also possible to substituted an active load for the resistor provided in the high frequency switch circuit according to the present invention, to adopt depletion type field-effect transistors having substantially a same pinch-off voltage, as the active elements used in the high frequency switch circuit, or to constitute the switch circuit in such a manner that the internal-control-voltage-output terminal is connected to the switch circuit via a low pass filter.

Further, in all embodiments of the high frequency switch circuit according to the present invention, it is also possible to constitute a single-pole-multiple-throw-type high frequency switch circuit by using a plurality of high frequency switch circuits according to the present invention, and specifically to constitute a single-pole-multiple-throw-type high frequency switch circuit by connecting one end of the high frequency signal path of each of the high frequency switch circuits to a common high frequency port.

Note that when the high frequency switch circuit according to the present invention is used to constitute a single-pole-multiple-throw-type high frequency switch circuit, any of the high frequency switch circuits combined with each other need not necessarily function as an independent "high frequency switch circuit". An embodiment as a single-pole-multiple-throw-type high frequency switch circuit can also be constituted in such a manner that a plurality of control-voltage-generating circuits having the above described constitution are used so as to be connected to a common high frequency port.

In this way, various modifications made to the above described embodiments are included within the scope of the invention, and other various embodiments may also be possible within the scope of the present invention.

INDUSTRIAL APPLICABILITY

The high frequency switch circuit according to the present invention can be used for a high frequency radio communications apparatus required to switch high frequency signal paths, such as a portable telephone and a wireless LAN terminal which correspond to the transmission/reception time division system and multi-band.

The invention claimed is:

1. A high frequency switch circuit having a switch circuit adapted to switch a connection state and a disconnection state of a high frequency signal path, and a control-voltage-generating circuit adapted to generate an internal control voltage for controlling the switch circuit on the basis of an external control signal, wherein the control-voltage-generating circuit includes a high-frequency-circuit-connecting terminal, an external-control-signal-input terminal, a depletion type field-effect transistor, first and second resistors, an internal-control-voltage-output terminal, a capacitor, and a diode, wherein the field-effect transistor has a grounded gate, a source connected to the external-control-signal-input terminal, and a drain connected to the internal-control-voltage-output terminal via a first node, wherein the first resistor has one terminal connected to the first node and the other terminal connected to a second node, wherein the second resistor has one terminal connected to the second node and the other terminal connected to the external-control-signal-input terminal, wherein the capacitor has one terminal connected to the high frequency signal path via the high-frequency-circuit-connecting terminal and the other terminal connected to the second node, wherein the diode has a cathode connected to the second node and an anode connected to the external-control-signal-input terminal, and wherein the internal-control-voltage-output terminal is connected to the switch circuit.

2. A single-pole-multiple-throw-type high frequency switch circuit having at least a first high frequency switch circuit and a second high frequency switch circuit, wherein the first and second high frequency switch circuits are the high frequency switch circuit according to claim 1, and wherein one end of the high frequency signal path in both the first and second high frequency switch circuits is connected to a common high frequency port, and one terminal of the capacitor provided in the control-voltage-generating circuit is connected to the common high frequency port via the high-frequency-circuit-connecting terminal.

3. The high frequency switch circuit according to claim 1, wherein all active elements used in the high frequency switch circuit are depletion type field-effect transistors having substantially the same pinch-off voltage as the field-effect-transistor.

4. The high frequency switch circuit according to claim 1, wherein the first resistor is an active load.

5. The high frequency switch circuit according to claim 1, wherein the internal-control-voltage-output terminal is connected to the switch circuit via a low pass filter.

6. The high frequency switch circuit according to claim 1, wherein the gate of the field-effect transistor is grounded via a third resistor.

7. A high frequency switch circuit having a switch circuit adapted to switch a connection state and a disconnection state of a high frequency signal path, and a control-voltage-generating circuit adapted to generate an internal control voltage for controlling the switch circuit on the basis of an external control signal, wherein the control-voltage-generating circuit comprises a high-frequency-circuit-connecting terminal, an external-control-signal-input terminal, a depletion type field-effect transistor, a first resistor, an internal-control-voltage-output terminal, a capacitor, and a diode, wherein the field-effect transistor has a grounded gate, a source connected to the external-control-signal-input terminal, and a drain connected to a second node, wherein the diode has a cathode connected to the second node and an anode connected to a first node, wherein the first resistor has one terminal connected to an electrical connection path between the first node and the internal-control-voltage-output terminal, and the other terminal connected to the external-control-signal-input terminal, wherein the capacitor has one terminal connected to the high frequency signal path via the high-frequency-circuit-connecting terminal and the other terminal connected to the first node, and wherein the internal-control-voltage-output terminal is connected to the switch circuit.

8. The high frequency switch circuit according to claim 7, wherein the gate of the field-effect transistor is grounded via a second resistor.

9. A single-pole-multiple-throw-type high frequency switch circuit having at least a first high frequency switch circuit and a second high frequency switch circuit, wherein the first and second high frequency switch circuits are the high frequency switch circuit according to claim 7, and wherein one end of the high frequency signal path in both the first and second high frequency switch circuits is connected to a common high frequency port, and one terminal of the capacitor provided in the control-voltage-generating circuit is connected to the common high frequency port via the high-frequency-circuit-connecting terminal.

10. The high frequency switch circuit according to claim 7, wherein all active elements used in the high frequency switch circuit are depletion type field-effect transistors having substantially the same pinch-off voltage as the field-effect-transistor.

11. The high frequency switch circuit according to claim 7, wherein the first resistor is an active load.

12. The high frequency switch circuit according to claim 7, wherein the internal-control-voltage-output terminal is connected to the switch circuit via a low pass filter.

* * * * *